United States Patent
Gorman et al.

(10) Patent No.: US 7,607,060 B2
(45) Date of Patent: Oct. 20, 2009

(54) SYSTEM AND METHOD FOR PERFORMING HIGH SPEED MEMORY DIAGNOSTICS VIA BUILT-IN-SELF-TEST

(75) Inventors: Kevin W. Gorman, Fairfax, VT (US); Emory D. Keller, Milton, VT (US); Michael R. Ouellette, Westford, VT (US); Donald L. Wheater, Hinesburg, VT (US)

(73) Assignee: International Business Machines Corporation, Armonk, NY (US)

( * ) Notice: Subject to any disclaimer, the term of this patent is extended or adjusted under 35 U.S.C. 154(b) by 382 days.

(21) Appl. No.: 11/531,035

(22) Filed: Sep. 12, 2006

(65) Prior Publication Data

US 2008/0082883 A1    Apr. 3, 2008

(51) Int. Cl.
*G11C 29/00* (2006.01)
*G01R 31/28* (2006.01)
(52) U.S. Cl. .................................. 714/733; 714/719
(58) Field of Classification Search ............... 714/719, 714/733
See application file for complete search history.

(56) References Cited

U.S. PATENT DOCUMENTS

| 4,414,665 | A | 11/1983 | Kimura et al. ............... 371/21 |
|---|---|---|---|
| 5,535,164 | A | 7/1996 | Adams et al. ............... 365/201 |
| 5,717,694 | A | 2/1998 | Ohsawa ....................... 371/5.1 |
| 5,796,745 | A | 8/1998 | Adams et al. .............. 371/21.1 |
| 5,912,901 | A * | 6/1999 | Adams et al. ............... 714/733 |
| 6,496,947 | B1 * | 12/2002 | Schwarz ....................... 714/30 |
| 6,622,229 | B2 | 9/2003 | Morgenstern et al. ....... 711/203 |
| 6,622,269 | B1 | 9/2003 | Ngo et al. .................... 714/718 |
| 6,862,703 | B2 | 3/2005 | Oonk .......................... 714/718 |
| 7,017,089 | B1 | 3/2006 | Huse .......................... 714/718 |
| 7,206,984 | B2 * | 4/2007 | Anzou ........................ 714/733 |
| 7,370,251 | B2 * | 5/2008 | Nadeau-Dostie et al. .... 714/723 |

* cited by examiner

*Primary Examiner*—James C Kerveros
(74) *Attorney, Agent, or Firm*—Downs Rachlin Martin PLLC

(57) ABSTRACT

A system and method for performing high speed memory diagnostics via built-in-self-test (BIST). A test system includes a tester for testing an integrated circuit that includes a BIST circuit and a test control circuit. The BIST circuit further includes a BIST engine and fail logic for testing an imbedded memory array. The test control circuit includes three binary up/down counters, a variable delay, and a comparator circuit. A method includes presetting the counters of the test control circuit, presetting the variable delay to a value that is equal to the latency of the fail logic, setting the BIST cycle counter to decrement mode, presetting the variable delay to zero, re-executing the test algorithm, performing a second test operation of capturing the fail data, and performing a third test operation of transmitting the fail data to the tester.

20 Claims, 4 Drawing Sheets

SYSTEM AND METHOD FOR PERFORMING HIGH SPEED MEMORY DIAGNOSTICS VIA BUILT-IN-SELF-TEST

FIELD OF THE INVENTION

The present invention generally relates to the field of testing integrated circuit devices. In particular, the present invention is directed to a system for and method of performing high speed memory diagnostics via built-in-self-test (BIST).

BACKGROUND

As integrated circuit technology has advanced, the complexity and density of circuit devices that are formed within a single integrated circuit (IC) has increased dramatically. Consequently, several problems have arisen with regard to testing such integrated circuits. For example, while the methodology for testing a memory array may be relatively straight forward, memory array chips typically have far fewer input/output (I/O) pins available to an IC tester than are required to adequately test the memory array. A general solution to this problem is to imbed test circuitry on the chip itself. Such testing facilities are frequently referred to as built-in-self-test (BIST), array self-test (AST), or array built-in self-test (ABIST) circuits and will hereinafter be referred to generically as BIST circuits.

A conventional testing apparatus for an IC memory includes a BIST circuit and at least one memory array that are coupled to an integrated circuit tester. According to the conventional BIST testing methodology, the IC tester scans data into the BIST circuit in order to initialize a number of state machine latches therein. Subsequently and in response to a clock signal, the BIST circuit applies internally generated test data and address data to the memory array and then compares the data that is read from the memory array with a set of expected data. In response to a discrepancy between the output data and the expected data, the BIST circuit indicates that a failure within memory array has been detected by generating a diagnostic fail signal. In response, the IC tester records the cycle the fail signal was asserted. Utilizing an algorithm, the IC tester calculates the cycle in which the failure actually occurred and reinitializes the BIST circuit. Thereafter, the BIST circuit is executed again to the cycle in which the failure occurred by applying clock signals for an appropriate number of cycles. The state machine data at the failing cycle is then scanned out by the IC tester and utilized to generate a bit-fail map for use in failure analysis.

One shortcoming of the conventional BIST testing methodology is the inability of the IC tester to test the memory array at typical operating speeds, e.g., above 200 megahertz (MHz), of fast memories. Operating at or above 200 MHz necessitates that the IC tester monitor the diagnostic fail signal at least every 5 nanoseconds (ns) in order to capture the cycle in which the failure of interest occurs. However, because of I/O gate delays and signal propagation delays, the feedback provided by the diagnostic fail signal is too slow to indicate the cycle in which the failure of interest occurs and then stop the BIST state machine in the very same clock cycle that generated the failure information. More specifically, present BIST solutions are unable to capture fail data for diagnostics and mapping at a high performance speed at which the memory under test is able to run. Consequently, ambiguity of the fails results because the BIST circuit is several clock cycles ahead of the diagnostic fail signal. As a result, the address and data information is no longer present at the time that the diagnostic fail signal occurs. Methods are available in order to pipeline the data and address information and retain the data until the diagnostic fail signal is generated. However, this results in more dedicated circuitry for test diagnostics, which consumes valuable chip area.

For these reasons, a need exists for a system for and method of performing high speed memory diagnostics via BIST, in order to perform memory diagnostics at full operating speed and in order to avoid implementing significant additional diagnostic circuitry on the integrated circuit device.

SUMMARY OF THE INVENTION

In one embodiment of the invention, and integrated circuit chip comprising a memory and built-in self-test circuitry configured to provide test information to said memory in response to a clock signal over a plurality of clock cycles. The test information comprises expected test data. Fail logic circuitry is configured to cyclically receive actual test values from the memory in response to the clock signal and compare the expected test data to the actual test values so as to generate a fail signal when any one of the actual test values does not match the expected test data. The fail logic circuitry comprises a data register for holding each of the actual test values in seriatim. Test control circuitry is responsive to the fail signal so as to cause the built-in self-test circuitry to reload the data register with the one of the actual test values corresponding to the fail signal.

In another embodiment of the invention, a method of testing an integrated circuit memory of an integrated circuit using built-in self-test circuitry and fail logic circuitry having a fail-signal latency of at least one clock cycle. The method comprises implementing via the built-in self-test circuitry a first pass of a memory testing algorithm so as to determine a fail in the integrated circuit memory as a function of faulty actual data being contained in a test data register. A fail signal is generated based on the faulty actual data being contained in the test data register. The built-in self-test circuitry is caused to perform a second pass of the memory testing algorithm as a function of each of the fail signal and the fail-signal latency so as to reload the faulty actual data into the test data register.

BRIEF DESCRIPTION OF THE DRAWINGS

For the purpose of illustrating the invention, the drawings show aspects of one or more embodiments of the invention. However, it should be understood that the present invention is not limited to the precise arrangements and instrumentalities shown in the drawings, wherein.

DETAILED DESCRIPTION

Figure 1A:
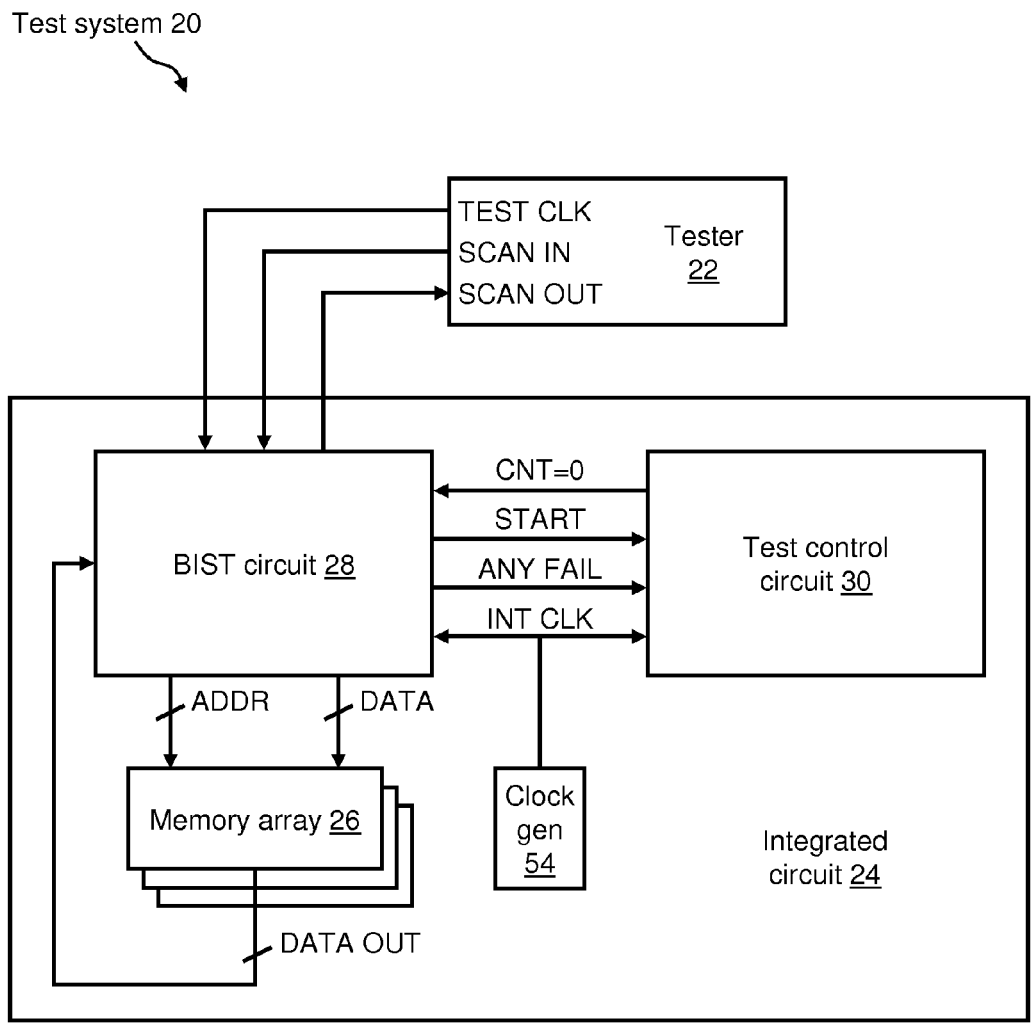
FIG. 1A illustrates a high level block diagram of a test system for performing high speed memory diagnostics via BIST.
Figure 1B:
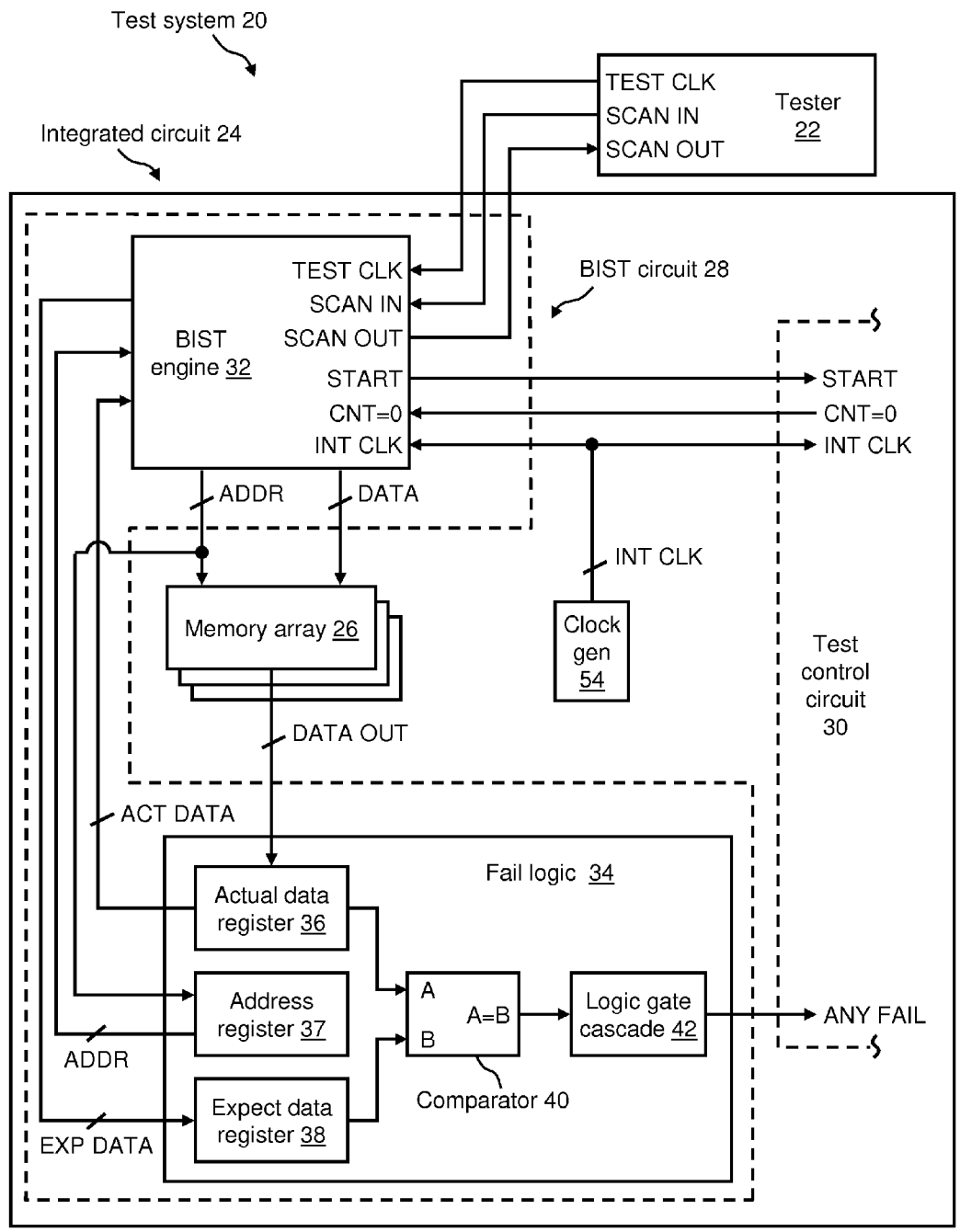
FIG. 1B illustrates a functional block diagram of a BIST circuit of the test system of FIG. 1A.
Figure 1C:
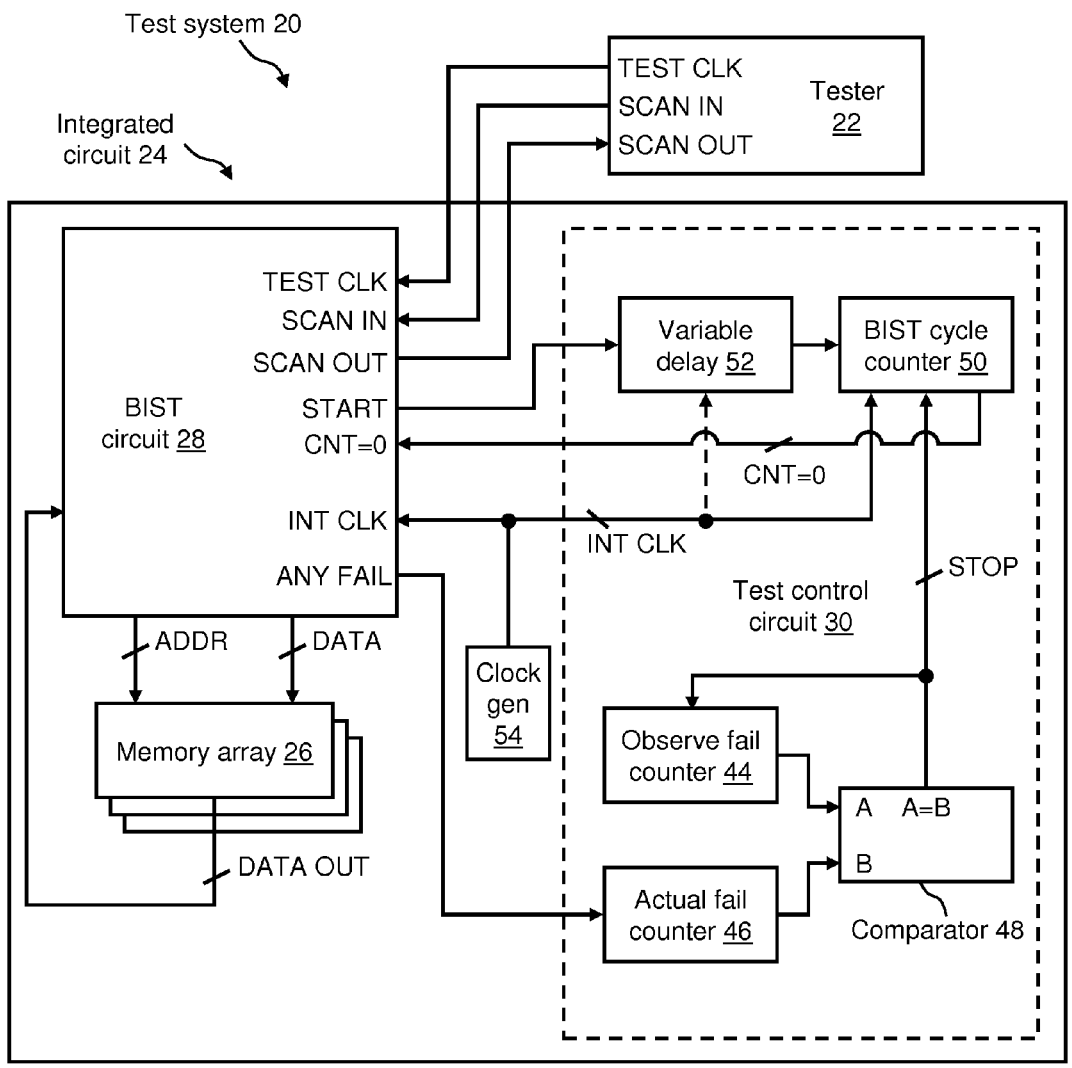
FIG. 1C illustrates a functional block diagram of a test control circuit of the test system of FIG. 1A.

Referring to the drawings, FIGS. 1A-1C illustrate a test system 20 for performing high speed memory diagnostics via BIST. Test system 20 includes a tester 22, which may be any custom or commercially available automatic test equipment (ATE) system, that provides an automated, usually computerdriven, approach to testing semiconductors, electronic circuits, and printed circuit board assemblies in, for example, a manufacturing or development environment. One example of a commercially available ATE system provider is Teradyne, Inc. (Boston, Mass.). Tester 22 is electrically connected to an integrated circuit 24, which may be part of virtually any integrated circuit device (not shown), e.g., application specific integrated circuit or system-on-chip, among others, that is under test. At a high level, integrated circuit 24 includes one or more imbedded functional memory arrays, such as memory array 26 shown, that provides memory for the normal operations that the integrated circuit device is designed to perform. As those skilled in the art will understand, memory array 26 may be any type of imbedded memory, e.g., SRAM or DRAM, suited to the particular design of integrated circuit 24. Those skilled in the art will readily appreciate that integrated circuit 24 may contain many other components than the components shown in FIGS. 1A-1C. Such other components are well known in the art and need not be discussed herein for an understanding of the inventive concepts disclosed herein.

Integrated circuit 24 also includes a BIST circuit 28 and a test control circuit 30 for controlling some aspects of the operation of the BIST circuit, as described below in more detail. The combination of BIST circuit 28 and test control circuit 30 forms an arrangement of on-chip test circuitry for assisting tester 22 in the testing of memory array 26 at the highest functional speed at which integrated circuit 24 is designed to operate during normal (generally non-testing) operating conditions, regardless of how fast or slow tester 22 can operate. BIST circuit 28 includes a BIST engine 32 and fail logic 34, each in functional communication with memory array 26. Fail logic 34 may include an actual data register 36, an address register 37, an expect data register 38, and a comparator 40 for comparing the actual and expected data registers to one another. Since actual data register 36 and expected data register 38, and hence the output of comparator 40, will typically be relatively long, e.g., 32 bits, 64 bits, or more, fail logic 34 may include a logic gate cascade 42 for resolving the long output of comparator 40 into a single pass/fail bit that is passed to test control circuit 30.

Test control circuit 30 generally includes an observe fail counter 44, an actual fail counter 46, a comparator 48, a BIST cycle counter 50, and a variable delay 52. Additionally, integrated circuit 24 (or the integrated circuit device (not shown)) more generally, includes a clock generator (gen) 54 that provides an internally generated high speed clock (INT CLK) signal to an INT CLK input of BIST engine 28 and to an input of BIST cycle counter 50 of test control circuit 30. Optionally, INT CLK is connected to an input of variable delay 52 of test control circuit 30. The operation of BIST circuit 28 and test control circuit 30 are described below in detail.

BIST circuit 28 may operate much in the same way as a standard BIST engine with regard to providing integrated circuit 24 the ability to generate internally the sequence of test signals that are required to verify the functionality of memory array 26. More specifically, BIST engine 32 may implement a testing state machine (not shown) that executes predetermined test algorithms for generating the required address (ADDR) and data (DATA) for testing memory array 26. BIST engine 32 receives a test clock (TEST CLK) signal, which is a low speed clock, and a scan input (SCAN IN) signal from tester 22, and generates a scan output (SCAN OUT) signal to tester 22. BIST engine 32 includes a data generator (not shown) that supplies the DATA signals and an address generator (not shown) that supplies the ADDR signals, as is well known. The initial settings of the testing state machine of BIST engine 32 are based on information that is received from tester 22 via SCAN IN. Subsequently, test data patterns are generated that are based on the initial settings of the state machine and ADDR and DATA is supplied to memory array 26 in order to access and verify the functionality of each memory location within the memory array.

More specifically, after BIST engine 32 is initialized by tester 22, it applies the selected test data pattern, via DATA, and address pattern, via ADDR, to memory array 26 in response to the INT CLK, which is the internally generated high speed BIST clock. Additionally, when BIST engine 32 begins execution of the test algorithm a start (START) signal is generated that is connected to an input of variable delay 52 of test control circuit 30. In response, output test data (DATA OUT) is read from memory array 26 and captured in actual data register 36 of fail logic 34 for comparison with expected data (EXP DATA) that is generated by the data generator of BIST engine 32 and captured in expect data register 38 of fail logic 34. Additionally, an address, i.e., ADDR, from BIST engine 32 that corresponds with DATA OUT and EXP DATA is captured in address register 37. The contents of actual data register 36 is the actual data (ACT DATA) from memory array 26, that, along with a corresponding ADDR that is stored in address register 37, is fed into BIST engine 32 and may be supplied to tester 22 for analysis via the SCAN OUT signal and by use of the TEST CLK signal (again, the low speed tester clock). Actual data register 36, address register 37, and expect data register 38 are static registers that have a width that is at least equal to the number of ADDR bits or DATA bits of memory array 32. Comparator 40 and logic gate cascade 42 perform the respective functions of comparing the contents of actual data register 36 to the contents of expect data register 38 and reducing the comparison to a more compact pass/fail flag (ANY FAIL signal) in order to determine whether memory array 26 is functioning properly, as is well known.

For example, for a given test cycle, when the contents of actual data register 36 matches the contents of expect data register 38, memory array 32 is functioning properly. By contrast, for a given test, when the contents of actual data register 36 does not match the contents of expect data register 38, memory array 26 is in a failing condition and a diagnostics fail (ANY FAIL) signal is generated via logic gate cascade 42. The ANY FAIL signal is transmitted to test control circuit 30 for additional processing. Additionally, because of the inherent latency of fail logic 34, e.g., in comparator 40 and logic gate cascade 42, the ANY FAIL signal will typically occur one or more clock cycles behind BIST engine 32, i.e., the ANY FAIL signal will typically occur one or more clock cycles (of INT CLK) behind the actual clock cycle at which the fail occurred within BIST engine 32. In this event, the "bad" data is no longer in actual data register 136 when the corresponding ANY FAIL signal occurs.

Test control circuit 30 detects an ANY FAIL condition and provides control functions for interrupting BIST circuit 28 and analyzing easily the failing condition of memory array 26, while, at the same time, avoiding the additional circuit overhead that is otherwise required to implement additional pipe stages in order to maintain the correct failing address and data over multiple pipe stages while the corresponding ANY FAIL signal is being generated. In the embodiment shown, test control circuit 30 utilizes three counters (i.e., observe fail counter 44, actual fail counter 46, and BIST cycle counter 50), a delayed start function, and a compare circuit (i.e., comparator 48) in order to capture the information for each fail condition in the course of performing three test operations. While three counters 44, 46, 50 are shown and described, alternative embodiments may be implemented without BIST cycle counter 50. In such an embodiment, the observe fail counter 44 and actual fail counter 46 would be used to capture fail data for a particular (Nth) fail by connecting the CNT=0 signal directly to the STOP signal. Such a configuration would pause the BIST engine 32 when the failing output data from memory array 26 is again contained in actual data register 36 on the Nth assertion of the ANY FAIL signal. Such an embodiment generally requires that the latency of fail logic 34 be less than one clock cycle, so this embodiment has a limited application and will not be discussed in further detail. As discussed below, in yet other alternative embodiments, observe fail counter 44 may be replaced by a non-incrementing register.

Observe fail counter 44, actual fail counter 46, and BIST cycle counter 50 each perform a well-known binary counting function. In particular, observe fail counter 44, actual fail counter 46, and BIST cycle counter 50 may each be a standard binary up/down counter and may each be of any user-defined width, such as, but not limited to, 16 to 32 bits. Observe fail counter 44 may be set to a predetermined value and incremented or decremented automatically in the process of executing a test operation. For example, observe fail counter 44 may be incremented or decremented with each occurrence of a STOP signal that is generated by comparator 48. Alternatively, observe fail counter 40 may be implemented as a static register, rather than a binary counter, that is set to a desired value in the process of executing a test operation. Actual fail counter 46 counts the occurrence of the ANY FAIL signal, which is generated any time that fail logic 34 of BIST circuit 28 detects a fail condition in the actual output data (DATA OUT) of memory array 26. BIST cycle counter 50 increments or decrements with each cycle of the INT CLK signal. The operation of BIST cycle counter 50 is initiated by the START signal from BIST engine 32, which may or may not be delayed via variable delay 52. The operation of BIST cycle counter 50 is suspended by the occurrence of the STOP signal from comparator 48.

Comparator 48 performs a well-known digital compare function. In particular, the digital output of observe fail counter 44 feeds an "A" input of comparator and the digital output of actual fail counter 46 feeds a "B" input of comparator. When the digital value of observe fail counter 44 matches the digital value of actual fail counter 46, an "A=B" output of comparator 48 is activated to generate the STOP signal that feeds a control input of BIST cycle counter 50. Variable delay 52 performs the task of delaying in time the START signal from BIST engine 32 as needed to compensate for latency inherent in fail logic 34. The delay time of variable delay 52 may range from zero to an amount of delay that is at least equal to the latency of fail logic 34, i.e., the time delay is relative to the corresponding BIST cycle in which a fail condition actually occurs. Variable delay 52 may be formed by use of any well-known techniques for delaying an electrical signal. In one example, the START signal feeds an input of a shift register function (not shown) that is clocked by INT CLK. The amount of delay through the shift register may be selectable via a set of controls (not shown) of variable delay 52. In another example, variable delay 52 may be formed of a set of varying gate delay paths through which the START signal is selectably transmitted therethrough. The output of variable delay 52 feeds a delayed START signal to a control input of BIST cycle counter 50.

With continuing reference to FIGS. 1A-1C, the operation of test system 20 is as follows. Observe fail counter 44 is preset initially to a number "n," which is the number of the fail of interest (e.g., the 27th fail), and both actual fail counter 46 and BIST cycle counter 50 are preset to "0" and set to increment. Additionally, variable delay 52 is set to the a time period that is equal to the latency of fail logic 34. For example, if the latency of fail logic 34 is three BIST cycles, variable delay 52 is set to delay the START signal by three cycles of INT CLK. Subsequently, a test algorithm of BIST engine 32 is initiated, which generates the START signal, and, in a first test operation, actual fail counter 46 increments with each occurrence of the ANY FAIL signal (e.g., 1, 2, 3, . . . 26, 27). Additionally, after receiving a delayed START signal, BIST cycle counter 50 increments with each occurrence of the INT CLK and, thus, accumulates the raw BIST cycle number. In the example in which observe fail counter 44 is preset to 27 and variable delay 52 is set to three INT CLK cycles, when ANY FAIL occurs for the 27th time the A and B inputs of comparator 48 match and, thus, the comparator generates the STOP signal to suspend the count operation of BIST cycle counter 50. For example, if the 27th ANY FAIL occurs at BIST cycle 482,569, when BIST cycle counter 50 is suspended, because of the STOP signal, its value is 482,569 minus 3 cycles (because of the action of variable delay 48) or 482,566, which is the actual BIST cycle in which the fail occurred.

In a second test operation, BIST cycle counter 50 is set to decrement from, in this example, a value of 482,566 and variable delay 52 is set to "0," which allows the BIST cycle counter to start immediately on the first cycle of INT CLK. Subsequently, the same test algorithm of the first test operation is reinitiated and BIST cycle counter 50 is decremented. After the occurrence of 482,566 cycles, BIST cycle counter 50 reaches a value of "0" and generates a count=zero (CNT=0) signal. The CNT=0 signal feeds an input of BIST engine 32 of BIST circuit 28 and causes the state machine (not shown) of the BIST engine to be internally paused at the 482,566th BIST cycle, which is the actual cycle in which the fail condition of memory array 26 occurs (in this example, the 27th fail). At this point, the "bad" or failing output data from memory array 26 is again contained in actual data register 36.

Subsequently, a third test operation occurs by which the captured failing memory output data DATA OUT is transmitted off-chip. More specifically, at the point at which BIST engine 32 is paused by test control circuit 30 (e.g., in the foregoing example on the 27th occurrence of ANY FAIL that occurred at the 482,566th BIST cycle), the failing DATA OUT is captured in actual data register 36, the failing ADDR is captured in address register 37, and the EXP DATA is captured in expect data register 38 and are, thus, ready to be observed by tester 22. Therefore, under the control of TEST CLK, which is the externally controlled slow tester clock, the contents of actual data register 36 (ACT DATA), address register 37 (ADDR), and expect data register 38 (EXP DATA) are transmitted via the SCAN OUT signal of BIST engine 32 to tester 22 for analysis thereof.

Figure 2:
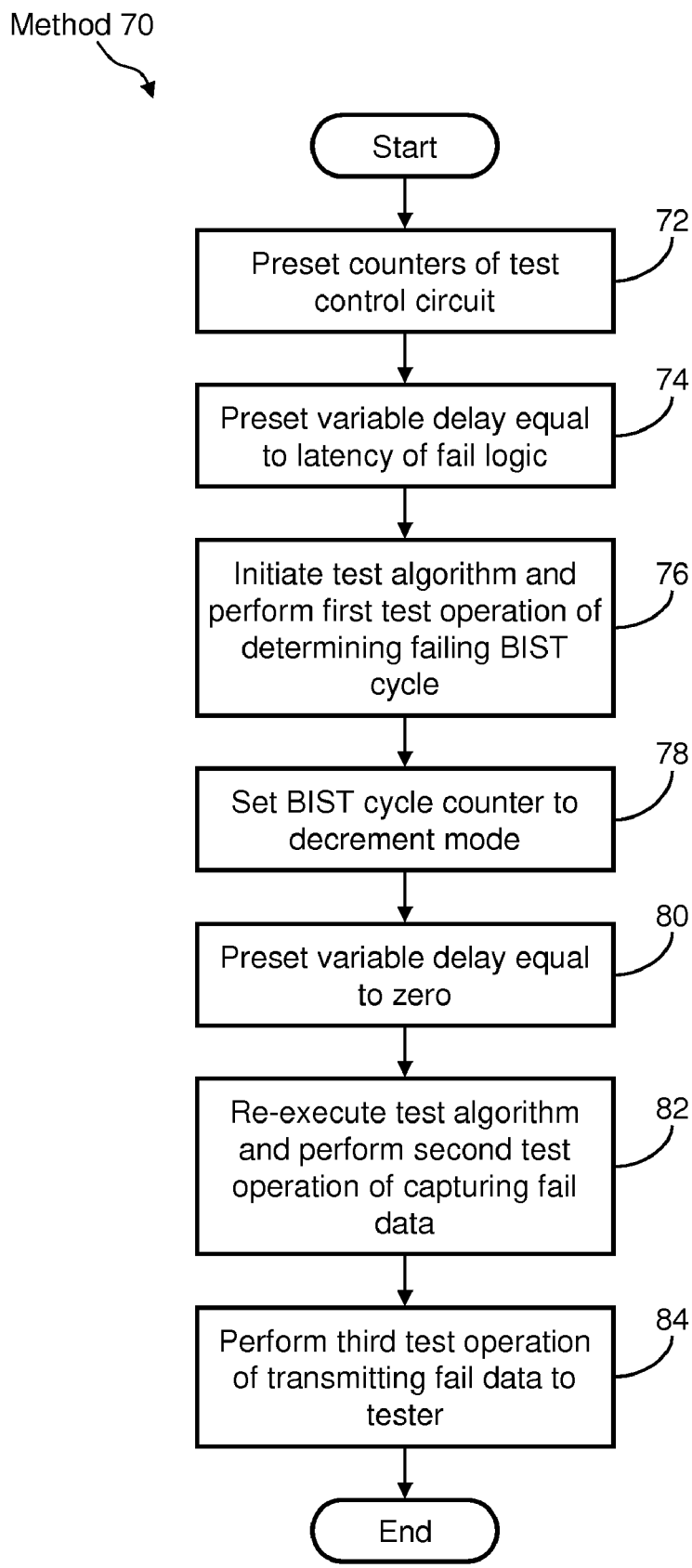
FIG. 2 illustrates a method of performing high speed memory diagnostics by use of three counters and a comparator circuit within a test control circuit of the test system of FIGS. 1A, 1B, and 1C.

FIG. 2 illustrates a method 70 of performing high speed memory diagnostics by use of three counters and a comparator circuit, e.g., counters 44, 46, 50 and comparator 48, respectively, within test control circuit 30 of test system 20 of FIGS. 1A-1C. Method 70 includes, but is not limited to, the following steps.

At step 72, three counters 44, 46, 50 of test control circuit 28 are preset. More specifically, observe fail counter 44 is preset initially to a number "n," which is the number of a predetermined fail of interest, and both actual fail counter 46 and BIST cycle counter 50 are preset to "0." Observe fail counter 44, actual fail counter 46, and BIST cycle counter 50 are set to increment mode.

At step 74, variable delay 52 is preset to a time delay that is equal to the latency of fail logic 34. For example, if the latency of fail logic 34 is three BIST cycles, variable delay 52 is set to delay the START signal that feeds BIST cycle counter 50 by three cycles of INT CLK.

At step 76, a test algorithm is initiated and a first test operation of determining the failing BIST cycle is performed. More specifically, a test algorithm of BIST engine 32 is initiated, which generates the START signal, and actual fail counter 46 increments with each occurrence of the ANY FAIL signal (e.g., 1, 2, 3, ... 26, 27). Additionally, BIST cycle counter 50 increments with each occurrence of the INT CLK and, thus, accumulates the raw BIST cycle number. When ANY FAIL occurs for the n-th time, as set in observe fail counter 44 in step 72, the A and B inputs of comparator 48 match and, thus, the STOP signal is generated in order to suspend the count operation of BIST cycle counter 50. Once suspended, the value of BIST cycle counter 50 is the raw BIST cycle count minus a number of clock cycles that represent the latency of fail logic 34. For example, if the STOP signal occurs at BIST cycle 482,569 and the latency of fail logic 34 is three clock cycles, the value of BIST cycle counter 50 is 482,569 minus 3 cycles (because of the action of variable delay 52) or 482,566, which is the actual BIST cycle in which the fail occurred.

At step 78, BIST cycle counter 50 is set to decrement from the value at which the STOP signal occurred in step 76.

At step 80, variable delay 52 is preset to "0" delay, which allows BIST cycle counter 50 to start immediately on the first cycle of INT CLK after START is generated by BIST engine 32.

At step 82, the test algorithm is re-executed and second test operation of capturing fail data is performed. More specifically, the same test algorithm of step 76 is re-executed. In doing so, BIST cycle counter 50 is decremented from the value at which the STOP signal occurred in step 76 to a value of "0" and generates a CNT=0 signal. The CNT=0 signal causes the state machine (not shown) of BIST engine 32 to be internally paused at the actual cycle in which the fail condition of memory array 26 occurs.

At step 84, a third test operation of transmitting fail data to tester 22 is performed. More specifically, at the point at which BIST engine 32 is paused, failing ACT DATA is captured in actual data register 36, the failing ADDR is captured in address register 37, and the EXP DATA is captured in expect data register 38. Therefore, under the control of TEST CLK, which is the externally controlled slow tester clock, the contents of actual data register 36, and address register 37, and expect data register 38 are transmitted via the SCAN OUT signal of BIST engine 32 to tester 22 for analysis thereof.

Alternatively, method 70 may be modified to allow multiple fail conditions of memory array 26 to be analyzed automatically by incrementing or decrementing observe fail counter 44 through a predetermined range of values and performing automatically the steps of method 70 for each fail condition that corresponds to each value, respectively, of observe fail counter 44. In particular, observe fail counter 44 may be incremented or decremented automatically with each occurrence of the STOP signal from comparator 48 as mentioned above.

An exemplary embodiment has been disclosed above and illustrated in the accompanying drawings. It will be understood by those skilled in the art that various changes, omissions and additions may be made to that which is specifically disclosed herein without departing from the spirit and scope of the present invention.

What is claimed is:

1. An integrated circuit chip, comprising:
a memory;
built-in self-test circuitry configured to execute a test algorithm provides test information to said memory in response to a clock signal over a plurality of clock cycles, said test information comprising expected test data, and said test algorithm having a starting point;
fail logic circuitry configured to, during execution of said test algorithm from said starting point, cyclically receive actual test values from said memory in response to said clock signal and compare said expected test data to said actual test values in a manner that generates a fail signal each time any one of said actual test values does not match said expected test data, said fail logic circuitry comprising a data register for holding each of said actual test values in seriatim; and
test control circuitry configured to cause said built-in self-test circuitry to reload said data register with the one of said actual test values corresponding to a desired occurrence of said fail signal by re-executing said test algorithm from said starting point and stopping the re-execution of said test algorithm upon the re-occurrence of the desired occurrence of said fail signal such that the one of said actual test values corresponding to the desired occurrence of said fail signal is contained in said data register when the re-execution of said algorithm is stopped.

2. The integrated circuit chip according to claim 1, wherein said test control circuitry includes increment/decrement clock-cycle counter circuitry configured to trigger said reload of said data register and stopping of the re-execution of said algorithm upon the re-occurrence of the desired occurrence of said fail signal.

3. The integrated circuit chip according to claim 1, wherein said test control circuitry has a built-in self test cycle counter and said test fail logic has a latency of at least one cycle of said clock signal in generating said fail signal, said test control circuitry further comprising delay circuitry configured to delay a start of said built-in self test cycle counter by a delay equal to said latency.

4. The integrated circuit chip according to claim 1, wherein said test fail logic has a latency of at least one cycle of said clock signal in generating said fail signal, said test control circuitry including:
an increment/decrement counter circuitry configured to trigger said reload of said data register, said increment/decrement counter circuitry having a clock-cycle counter for counting cycles of said clock signal and responsive to a start signal from said built-in self test circuitry; and
delay circuitry configured to impart a delay into said start signal, said delay being equal to said latency.

5. The integrated circuit chip according to claim 4, wherein said test control circuitry further includes:
an actual fail counter configured to count occurrences of said fail signal, said actual-fail counter for containing a fail count value;
an observe fail register configured to contain a desired observe fail value; and
a comparator configured to compare said fail count value to said desired observe fail value and, upon detecting a match therebetween, issue a stop signal to stop said clock-cycle counter.

6. The integrated circuit chip according to claim 5, wherein said observe fail register comprises an auto-incrementing counter.

7. The integrated circuit chip according to claim 1, wherein said test control circuitry includes:

an actual fail counter configured to count occurrences of said fail signal and contain a fail count value;

an observe fail register configured to contain a desired observe fail value; and a comparator configured to compare said fail count value to said desired observe fail value and, upon detecting a match therebetween, issue a stop signal.

8. The integrated circuit chip according to claim 7, wherein said observe fail register comprises an auto-incrementing counter.

9. An integrated circuit, comprising:

a memory;

first means for executing a test algorithm that provides test information to said memory in response to a clock signal over a plurality of clock cycles, said test information comprising expected test data, and said test algorithm having a starting point;

second means for during execution of said test algorithm from said starting pint, cyclically receiving actual test values from said memory in response to said clock signal and comparing said expected test data to said actual test values a manner that generates a fail signal each time any one of said actual test values does not match said expected test data;

a data register for holding each of said actual test values in seriatim; and third means for causing said first means to reload said data register with the one of said actual test values corresponding to a desired occurrence of said fail signal by re-executing said test algorithm from said starting point and stopping the re-execution of said test algorithm on the re-occurrence of the desired occurrence of said fail signal such that the one of said actual test values corresponding to the desired occurrence of said fail signal is contained in said data register when the re-execution of said algorithm is stopped.

10. The integrated circuit according to claim 9, wherein said third means has a clock cycle counter and said second means has a latency of at least one cycle of said clock signal in generating said fail signal, said third means comprising a fourth means for delaying a start of said clock-cycle counter by a delay equal to said latency.

11. The integrated circuit according to claim 9, further comprising a fifth means for automatically utilizing said first, second and third means for each of a plurality of observe-fail values.

12. A method of testing an integrated circuit memory of an integrated circuit using built-in self-test circuitry and fail logic circuitry having a fail-signal latency of at least one clock cycle, comprising:

implementing via the built-in self-test circuitry a first pass of a memory testing algorithm to determine a fail in the integrated circuit memory as a function of faulty actual data being contained in a test data register;

generating a fail signal based on said faulty actual data being contained in said test data register; and causing said built-in self test circuitry to perform a second pass of said memory testing algorithm as a function of each of said fail signal and the fail-signal latency to reload said faulty actual data into said test data register.

13. The method according to claim 12, further comprising following said reload of said faulty actual data into said test data register the step of reading said faulty actual data out of said test data register for diagnosis.

14. The method according to claim 12, wherein the integrated circuit memory has a full operating speed and the method includes performing said first and second passes at full operating speed.

15. The method according to claim 12, further comprising the step of incrementing a clock cycle counter during each of said first pass and during said generating step, said incrementing being delayed by the fail-signal latency.

16. The method according to claim 15, further comprising the step of decrementing said clock cycle counter, said second pass of said memory testing algorithm being performed as a function of said decrementing.

17. The method according to claim 12, wherein the method allows for the observance of a sequential fail number N, the method further comprising:

providing an observe-fail value equal to N;

comparing a fail count to said observe-fail value; and stopping said first pass of said memory testing algorithm as a function of said fail count being equal to said observe-fail value.

18. The method according to claim 17, wherein the step of providing said observe-fail value includes automatically incrementing an observe-fail counter within the integrated circuit.

19. The method according to claim 12 wherein the method allows for the observance of a range of fails, the method further comprising:

performing the steps of claim 12 for a first observe-fail value in said range;

automatically generating a second observe-fail value in said range; and performing the steps of claim 12 for said second observe-fail value.

20. The method according to claim 19, wherein the step of automatically generating said second observe-fail value includes automatically incrementing an observe-fail counter within the integrated circuit.

* * * * *